United States Patent [19]

Matsunaga et al.

[11] Patent Number: 5,592,088

[45] Date of Patent: *Jan. 7, 1997

[54] MULTIPLE-COIL ADOPTING A QUADRATURE DETECTION METHOD APPLIED THERETO AND A SIGNAL PROCESSING CIRCUIT EMPLOYING THE SAME IN AN MRI APPARATUS IN A VERTICAL MAGNETIC SYSTEM

[75] Inventors: Yoshikuni Matsunaga, Hachioji; Tetsuhiko Takahashi, Soka; Etsuji Yamamoto, Akishima, all of Japan

[73] Assignees: Hitachi, Ltd.; Hitachi Medical Corporation, both of Tokyo, Japan

[*] Notice: The term of this patent shall not extend beyond the expiration date of Pat. No. 5,457,386.

[21] Appl. No.: 427,868

[22] Filed: Apr. 26, 1995

Related U.S. Application Data

[63] Continuation of Ser. No. 981,399, Nov. 25, 1992, Pat. No. 5,457,386.

[30] Foreign Application Priority Data

Nov. 26, 1991 [JP] Japan .................................. 3-310585

[51] Int. Cl.⁶ .............................................. G01R 33/48
[52] U.S. Cl. ............................................ 324/318; 324/322
[58] Field of Search ................................... 324/318, 322, 324/300; 128/653.5; 335/296, 299

[56] References Cited

U.S. PATENT DOCUMENTS

| | | | |
|---|---|---|---|
| 4,752,738 | 6/1988 | Patrick et al. | 324/318 |
| 4,825,162 | 4/1989 | Roemer et al. | 324/318 |
| 4,918,388 | 5/1990 | Mehdizadeh et al. | 128/653.5 |
| 5,198,768 | 3/1993 | Keren | 324/318 |
| 5,256,971 | 10/1993 | Boskamp | 324/318 |
| 5,280,246 | 1/1994 | Takahashi et al. | 324/322 |
| 5,280,249 | 1/1994 | Kess | 324/318 |
| 5,430,378 | 7/1995 | Jones | 324/318 |
| 5,457,386 | 10/1995 | Matsunaga et al. | 324/318 |
| 5,471,142 | 11/1995 | Wang | 324/318 |

FOREIGN PATENT DOCUMENTS

| | | | |
|---|---|---|---|
| 5237076 | 9/1993 | Japan | 128/653.5 |
| 6054821 | 3/1994 | Japan | 128/653.5 |

*Primary Examiner*—Sandra L. O'Shea
*Assistant Examiner*—Raymond Y. Mah
*Attorney, Agent, or Firm*—Antonelli, Terry, Stout & Kraus

[57] ABSTRACT

A probe for an MRI apparatus in a vertical magnetic field system including: an array coil which is formed by arranging a plurality of unit coils, which can be driven independently of one another, in a direction perpendicularly intersecting a direction of a static magnetic field; and a compensating coil which forms a magnetic field in a direction perpendicularly intersecting both a direction of a magnetic field formed by the array coil and the direction of the magnetic field, a signal detected by the array coil and a signal detected by the compensating coil being composed so as to be in phase with each other, thereby to be outputted.

7 Claims, 8 Drawing Sheets

CHARACTERISTICS OF SENSITIVITY OF A DEPTH DIRECTION

F I G. 10
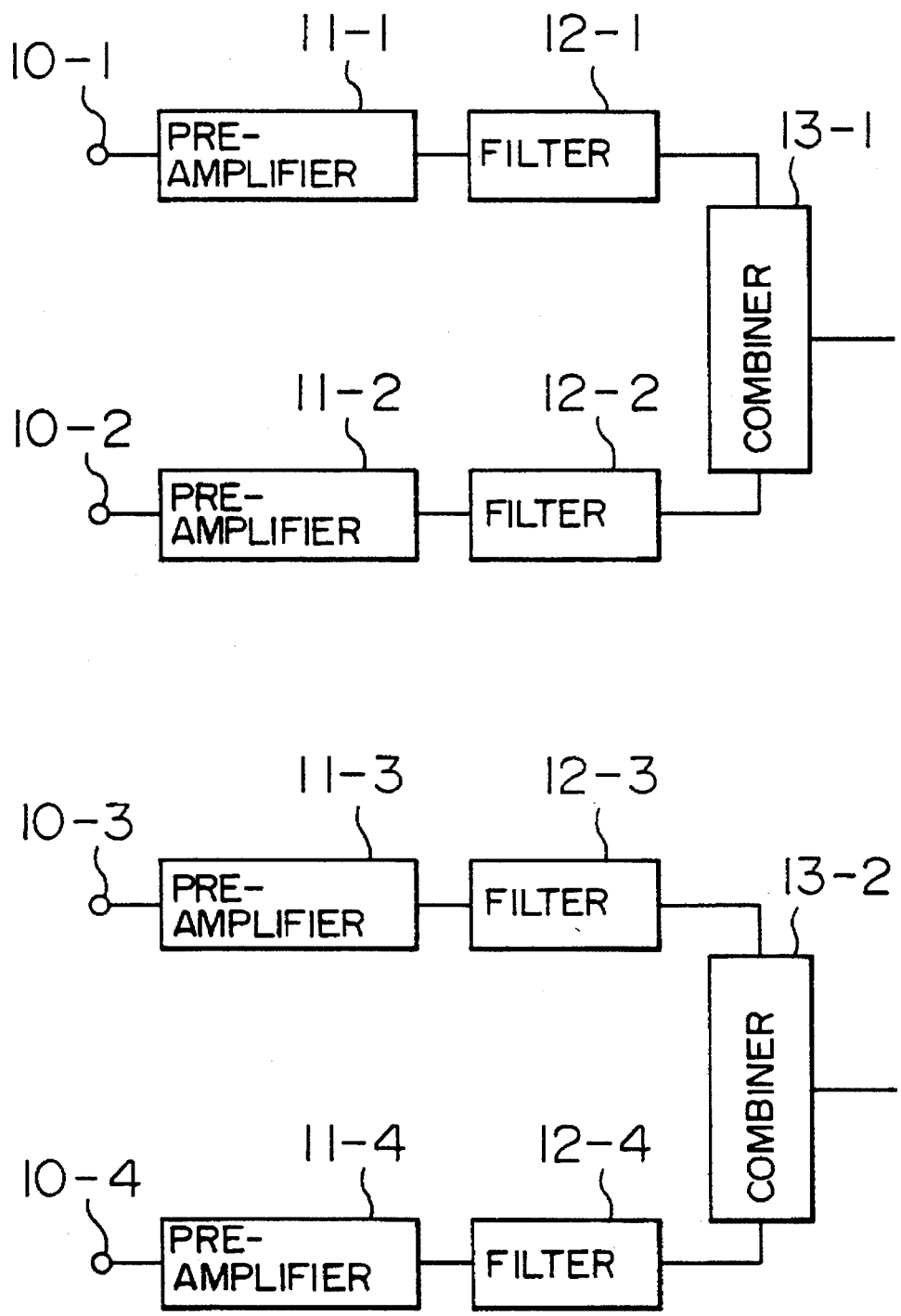

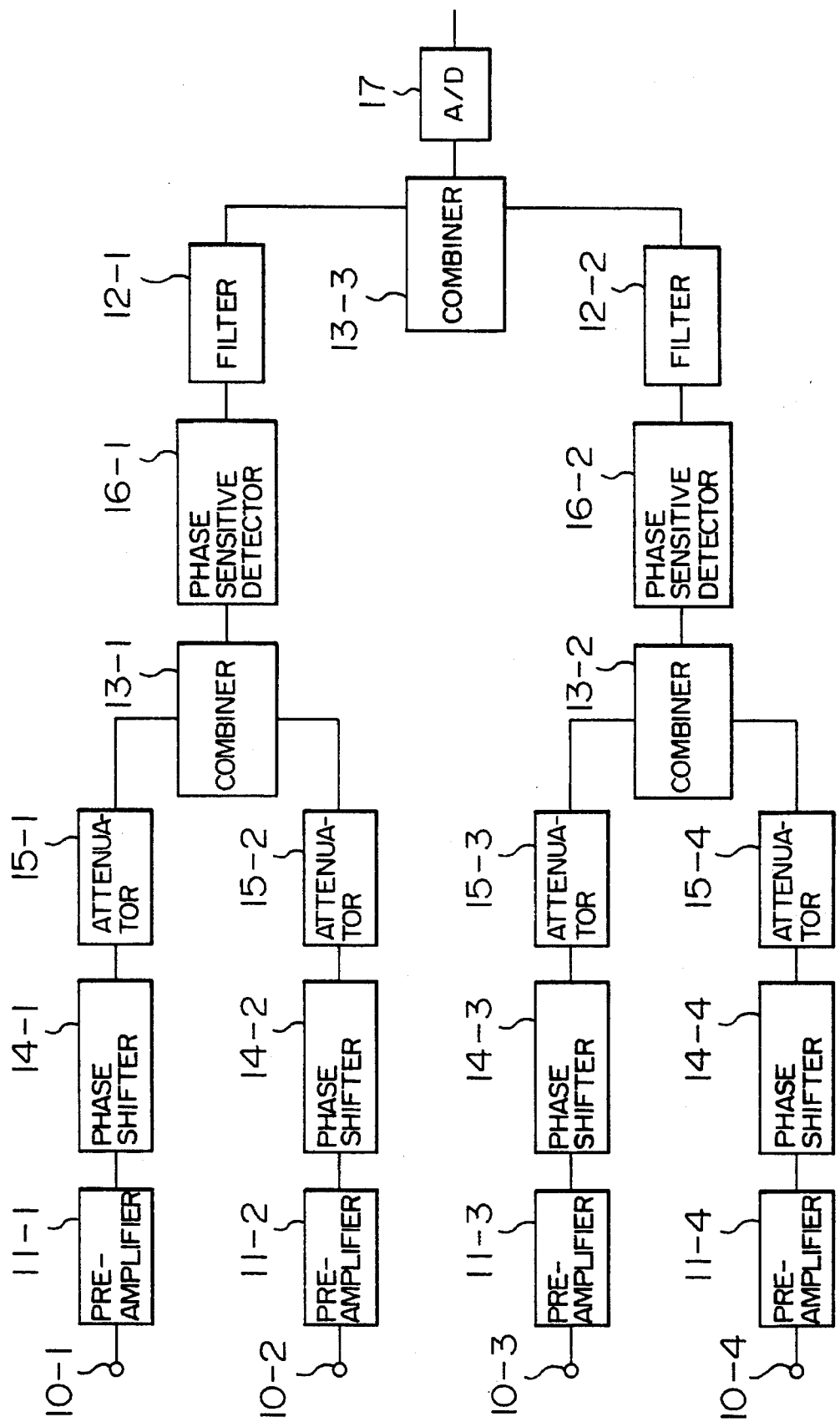

MULTIPLE-COIL ADOPTING A QUADRATURE DETECTION METHOD APPLIED THERETO AND A SIGNAL PROCESSING CIRCUIT EMPLOYING THE SAME IN AN MRI APPARATUS IN A VERTICAL MAGNETIC SYSTEM

This application is a Continuation of application Ser. No. 07/981,399, filed Nov. 25, 1992 now U.S. Pat. No. 5,457,386.

BACKGROUND OF THE INVENTION

The present invention relates to an RF probe for a Magnetic Resonance Imaging (hereinafter, referred to as "MRI" for short, when applicable) apparatus in a vertical magnetic system which serves to detect an NMR (nuclear magnetic resonance) signal sent from hydrogen, phosphorus or the like contained in a subject to image the distribution of density, the distribution of a relaxation time, and the like of the nuclei, and more particularly to an RF probe for an MRI apparatus which solves a problem in that a signal-to-noise (S/N) ratio of a multiple-coil is decreased in a deeper detection region.

In an MRI apparatus, the inspection and the photographing of a subject have heretofore been performed using various kinds of RF coils for the head and various kinds of RF coils for the belly which are arranged so as to surround a part of interest of the subject (e.g., a human being), a surface RF coil which is hardly influenced by the motion of the heart or the like, and the like.

Although the above-mentioned surface coil has higher sensitivity than that of the coil for the head and the coil for the belly, its field of view is necessarily limited. As a result, there arises a problem in that when a wide region of the body such as the spine is inspected, the photographing must be performed by several times by moving the surface coil, and therefore, this inspection employing the surface coil needs too much time.

On the other hand, there has been proposed a method in which a plurality of surface coils are arranged in such a way that they are suitably overlapped so as not to be mutually coupled to the surface coils adjacent thereto, and NMR signals which are received by the surface coils are composed thereby to widen substantially the field of view, i.e., a multiple-coil for a horizontal magnetic field MRI. Incidentally, the principle of this method is described in Publication of the Translation of International Patent Application No. 1990/500,175, JP-A-2-13432, and Magnetic Resonance in Medicine, Vol. 16, pp. 192–225 (1990) for example.

In the multiple-coil shown in the above-mentioned prior art technology, the field of view is widened and a high S/N ratio is obtained in a shallower detection region (near the coil). However, there arises a problem in that the S/N ratio is remarkably decreased in a deeper detection region and thus the S/N ratio in the deeper detection region is poor as compared with the coil for the belly.

This situation will hereinbelow be concretely described with reference to FIG. 1. In the above-mentioned multiple-coil, the field of view is widened, and thus, in a parallel conductor part at the center of the coil, the characteristics of sensitivity of a depth direction (Z-axis direction) as indicated by a of FIG. 1 are shown. On the other hand, the coil for the belly which is arranged so as to sorround the subject shows the characteristics of sensitivity of the depth direction as indicated by b of FIG. 1. Thus, in the above-mentioned multiple-coil, although a higher S/N ratio is obtained in the shallower detection region, in the deeper detection region, the S/N ratio is decreased to be smaller than that of the coil for the belly. If this problem can be solved, the measurement region by the surface coil can be widened.

On the other hand, as for a method of improving the reception sensitivity of the detection coil, there has been used a QD (Quadrature Detection) method which is described in Journal of Magnetic Resonance, Vol. 54, pp. 324–327 (1983). This method is a method wherein two coils for generating respective magnetic fields perpendicularly intersecting each other are provided to detect two NMR signals perpendicularly intersecting each other, and a phase of one detection signal is shifted by 90 degrees to compose the two detection signals, thereby to detect the composite signal at high sensitivity. According to this method, in the case where the intensity of the signal sent from one coil is equal to that of the signal sent from the other coil perpendicularly intersecting the one coil, the sensitivity is ideally improved by $\sqrt{2}$ times as compared with the case of the detection of a single signal. However, in the above-mentioned method, QD of the multiple-coil is not taken into consideration.

An example in which the QD method is applied to the multiple-coil for an MRI apparatus in a horizontal magnetic system is described in SMRM "Quadrature Switchable Spine Arry Coils", p.952, 1989.

However, in the case where the QD method is directly applied to the MRI apparatus in the vertical magnetic system, the wide field of view required for the diagnosis cannot be photographed at high sensitivity, and thus, there is no availability.

SUMMARY OF THE INVENTION

The present invention was made by considering the above-mentioned circumstances, and an object thereof is to provide a probe for an MRI apparatus in a vertical magnetic system (a static magnetic field is directed upwardly), which is designed in such a way as to prevent the S/N ratio from being decreased in even a deeper region, by overcoming the above-mentioned problems.

In order to attain the above-mentioned object of the present invention, there is provided an RF probe for an MRI apparatus in which a static magnetic field is generated in a predetermined space, a nuclear spin of a subject placed in the space is excited by a magnetic field having a radio frequency, and a nuclear magnetic resonance signal sent from the nuclear spin of the subject is detected using a multiple-coil, which is arranged in such a way that a plurality of unit surface coils are overlapped so as to have the minimum mutual coupling to the unit surface coils adjacent thereto, including: a multiple-coil which is arranged in such a way that a direction of an array thereof is made to intersect perpendicularly that of the static magnetic field; and a compensating coil which serves to form a magnetic field perpendicularly intersecting both a direction of a magnetic field formed by the multiple-coil and that of the static magnetic field, wherein information sent from the compensating coil and that sent from the multiple-coil are obtained simultaneously, and the resultant signals are composed to improve sensitivity.

In other words, the present invention is designed in such a way as to combine the multiple-coil and the QD method with each other in the MRI apparatus having a vertical magnetic field system.

By adopting the above-mentioned arrangement, in the MRI apparatus in a vertical magnetic field system the photographing of the head, the neck, the belly and the knee can be performed at high sensitivity.

BRIEF DESCRIPTION OF THE DRAWINGS

FIG. 10 is a block diagram showing an arrangement of still another embodiment of the receiving circuit of the present invention; and FIG. 11 is a block diagram showing an arrangement of yet another embodiment of the receiving circuit of the present invention.

DESCRIPTION OF THE PREFERRED EMBODIMENTS

Figure 2:
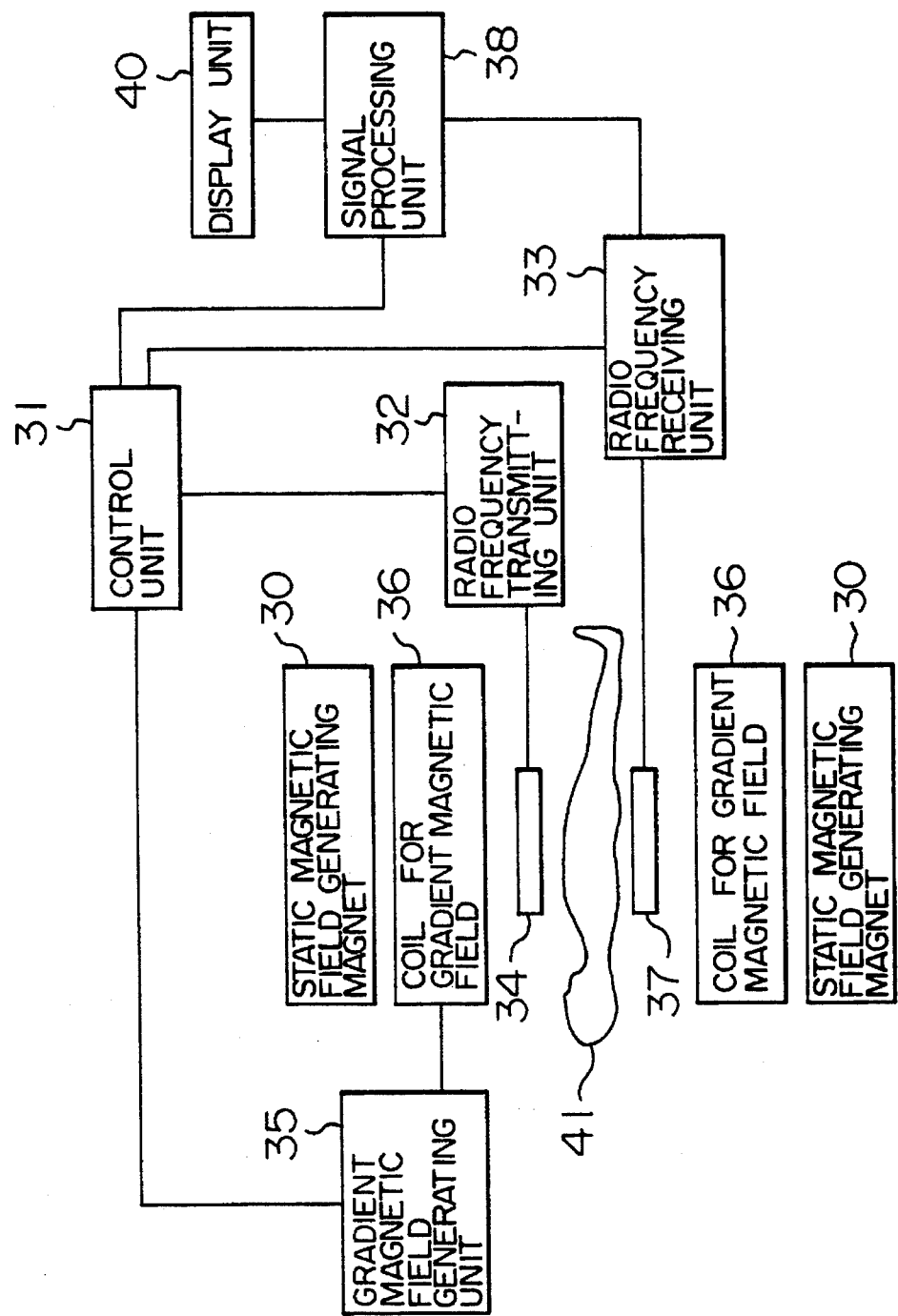
FIG. 2 is a block diagram showing an example of the whole configuration of an MRI apparatus relating to the present invention.

FIG. 2 is a block diagram showing the whole configuration of an example of an MRI apparatus in a vertical magnetic system relating to the present invention. The MRI apparatus for obtaining a transverse image of a subject 41 by utilizing an NMR phenomenon includes a magnet 30 for generating a static magnetic field, a unit 38 for processing a signal, a unit 32 for transmitting a signal having a radio frequency, a unit 33 for receiving a signal having a radio frequency, a unit 35 for generating a gradient magnetic fields, a display unit 40, and a unit 31 for controlling the associated units. The static magnetic field generating magnet 30 serves to generate a powerful, uniform and vertical static magnetic field around the subject 41 and is arranged in a space surrounding the subject 41. An output of the radio frequency transmitting unit 32 is sent to a transmission coil 34 to generate a radio frequency. An output of the gradient magnetic field generating unit 35 is sent to a coil 36 for a gradient magnetic field to generate gradient magnetic fields Gx, Gy and Gz of three directions X, Y and Z. The slice plane of the object 41 can be set depending on a method of applying the gradient magnetic fields. The radio frequency receiving unit 33 receives a signal sent from a receiving coil 37. The receiving coil 37 and the radio frequency receiving unit 33 have the respective arrangements which will be described in the preferred embodiments of the present invention as will be explained later. An output of the radio frequency receiving unit 33 is subjected to the Fourier transform, the image reconstitution and the like in the signal processing unit 38 and then is displayed on the display unit 40. Incidentally, in FIG. 2, the transmission coil 34, the receiving coil 37 and the gradient magnetic field generating coil 36 are arranged in the space surrounding the subject 41.

Figure 1:
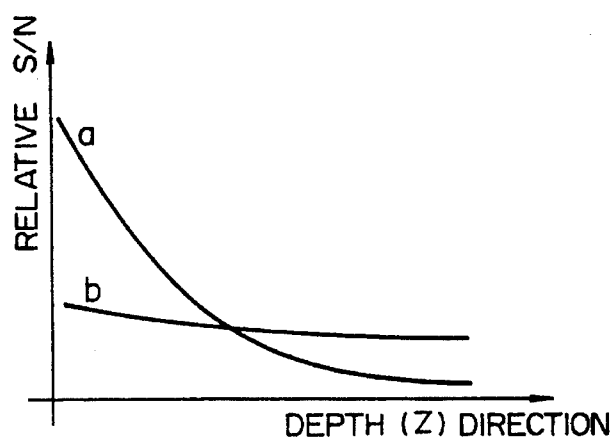
FIG. 1 is a graphical representation showing a relationship between a detection depth of a multiple-coil and a coil for the belly and the sensitivity.
Figure 3:
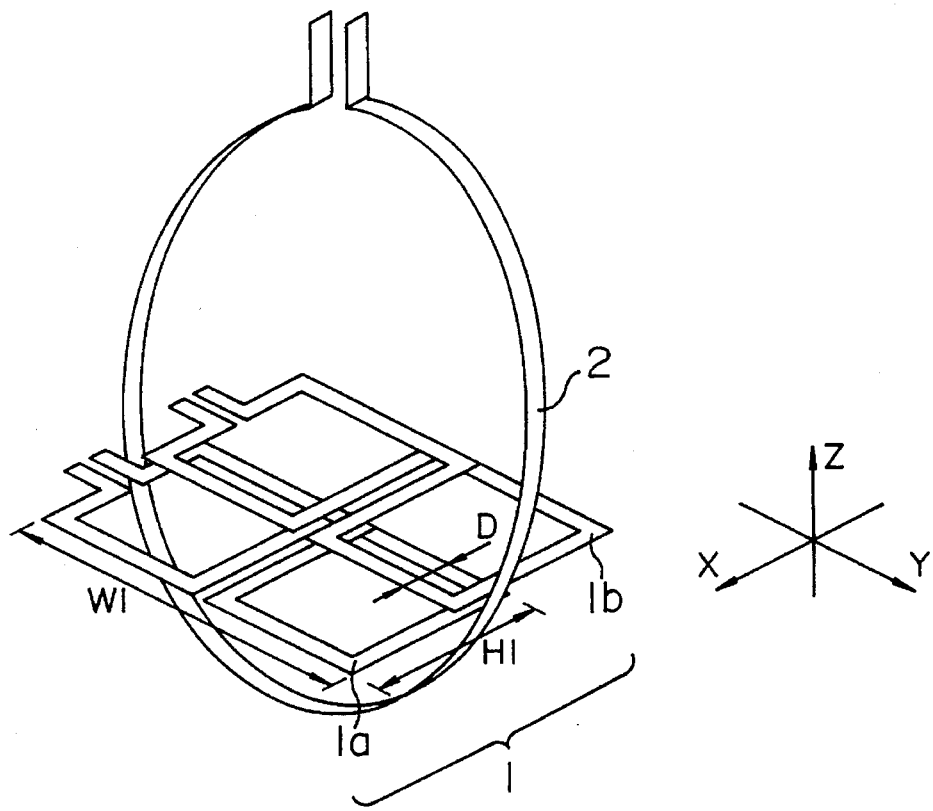
FIG. 3 is a perspective view showing an arrangement of one embodiment of a coil according to the present invention.

FIG. 3 is a perspective view showing an arrangement of one embodiment of a coil according to the present invention. A multiple-coil 1 is arranged in such a way that unit surface coils 1a and 1b (not limited to two coils) each of which measures W1 in length (y-axis direction) and H1 in width (x-axis direction) are, for example, disposed in a direction of the body axis of the subject (not shown) (x-axis direction) in a unidimensional manner. In this connection, the unit surface coils 1a and 1b are overlapped by a distance D such that the mutual coupling therebetween becomes minimum. If H1=170 mm, and W1=270 mm, D is about 12 mm.

It is to be understood that the above-mentioned overlapping distance D changes delicately depending on a ratio of the length to the width, i.e., W1/H1. The above-mentioned multiple-coil 1 serves to detect an NMR signal of the y-axis direction of a nuclear spin which rotates on the X-Y plane perpendicularly intersecting the direction of the static magnetic field (Z-axis direction). That is, the multiple-coil 1 forms the magnetic field in the y-axis direction.

In the present embodiment, as shown in FIG. 3, a compensating or RF coil 2 which serves to form a magnetic field in the x-axis direction perpendicularly intersecting the y-axis direction as the direction of the magnetic field which is formed by the multiple-coil 1 is provided in the multiple-coil 1.

The compensating or RF coil 2 is a circular coil or an elliptic coil.

Now, since the y-axis direction as the direction of the magnetic field formed by the multiple-coil 1 intersects perpendicularly the x-axis direction as the direction of the magnetic field formed by the compensating coil 2, the two magnetic fields do not interfere with each other. As a result, it is possible to detect simultaneously signals from the above-mentioned two coils. Incidentally, in the present embodiment, the circular coil is shown as the compensating coil. However, the present invention is not limited thereto or thereby. That is, it is to be understood that other coils, each of which serves to form a magnetic field in the x-axis direction so as to surround the subject, may be available.

Figure 4:
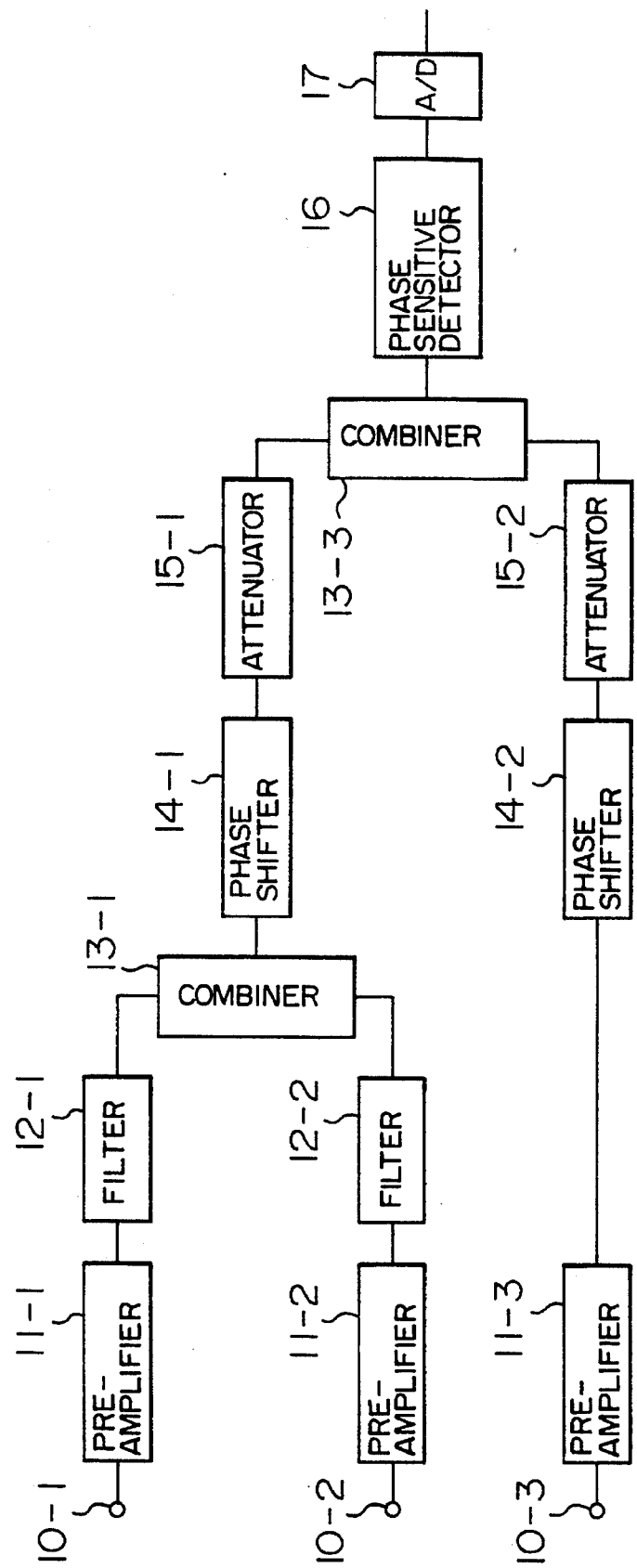
FIG. 4 is a block diagram showing an arrangement of one embodiment of a receiving circuit of the present invention.

FIG. 4 is a block diagram showing an arrangement of a receiving system employing the coil of the embodiment shown in FIG. 3. To input terminals 10-1 and 10-2 are respectively connected the unit surface coils 1a and 1b (refer to FIG. 3) of the multiple-coil 1 which are disposed in a unidimensional manner so as to have the minimum mutual coupling. NMR signals which have been received at the input terminals 10-1 and 10-2 are respectively amplified by pre-amplifiers 11-1 and 11-2 which include respective impedance matching circuits. Then, the bands of the resultant signals are respectively limited through filters 12-1 and 12-2 in such a way that the noises sent from the unit surface coils 1a and 1b are not superposed on each other. Then, the resultant signals are composed by a combiner 13-1.

To an input terminal 10-3 is connected the compensating coil 2 shown in FIG. 3. An NMR signal which has been received at the input terminal 10-3 is amplified by a pre-amplifier 11-3 which has an impedance matching circuit. Moreover, the outputs of the combiner 13-1 and the pre-amplifier 11-3 are respectively applied to phase shifters 14-1 and 14-2 for making those outputs in phase with each other (for example, the amount of phase shift of the phase shifter 14-1 is set to 0 degree, and that of the phase shifter 14-2 is set to about +90 degrees or −90 degrees) and attenuators 15-1 and 15-2 for adjusting the gains of those outputs so as to fulfill the optimal composition condition. Then, the resultant signals are composed by a combiner 13-3.

Now, the description will hereinbelow be given to the optimal composition condition.

First, it is assumed that the amplitude of the signal obtained by the multiple-coil is S1, the signal-to-noise ratio inherent in the multiple-coil is SN1, the amplitude of the signal obtained by the compensating coil is S2, and the signal-to-noise ratio inherent in the compensating coil is SN2. Then, the maximum value SN of the theoretical signal-to-noise ratio after composing the signals of the multiple-coil and the compensating coil is expressed by the square root of the sum of SN1 squared plus SN2 squared. That is, the expression of the maximum value SN is as follows.

$$SN = \sqrt{(SN1^2 + SN2^2)} \quad (1)$$

But, the maximum value SN given by the expression (1) is obtained when S2 is multiplied by a coefficient k given by the following expression to perform the composition in such a way that S2 is in phase with S1.

$$k = S1/S2 \times (SN2/SN1)^2 \quad (2)$$

More specifically, the adjustment needs to be performed in such a way that an amplification factor of the output of the compensating coil becomes k times as large as that of the multiple-coil. This can be, for example, realized by setting an attenuation factor of the attenuator for the multiple-coil to 1 and by setting an attenuation factor of the attenuator for the compensating coil to k. In general, since if a part to be photographed is changed, the coil used is changed, k is correspondingly changed. Therefore, the value of k needs to be optimally adjusted in accordance with the position of the part to be photographed.

In order to fulfill this request, the attenuation factors of the attenuators 15-1 and 15-2 are made variable depending on the field of view of the photographing and the position of the region of interest on the image and in accordance with a control signal sent from the control unit (not shown). The present embodiment can cope with even a specific case where the number of unit surface coils and that of compensating coils are different from each other.

By adopting the above-mentioned procedure, the distribution of the sensitivity of the coil can be controlled so as to increase the sensitivity (S/N ratio) in a certain region, and the S/N ratio in the deeper detection region can be prevented from being decreased.

Figure 5:
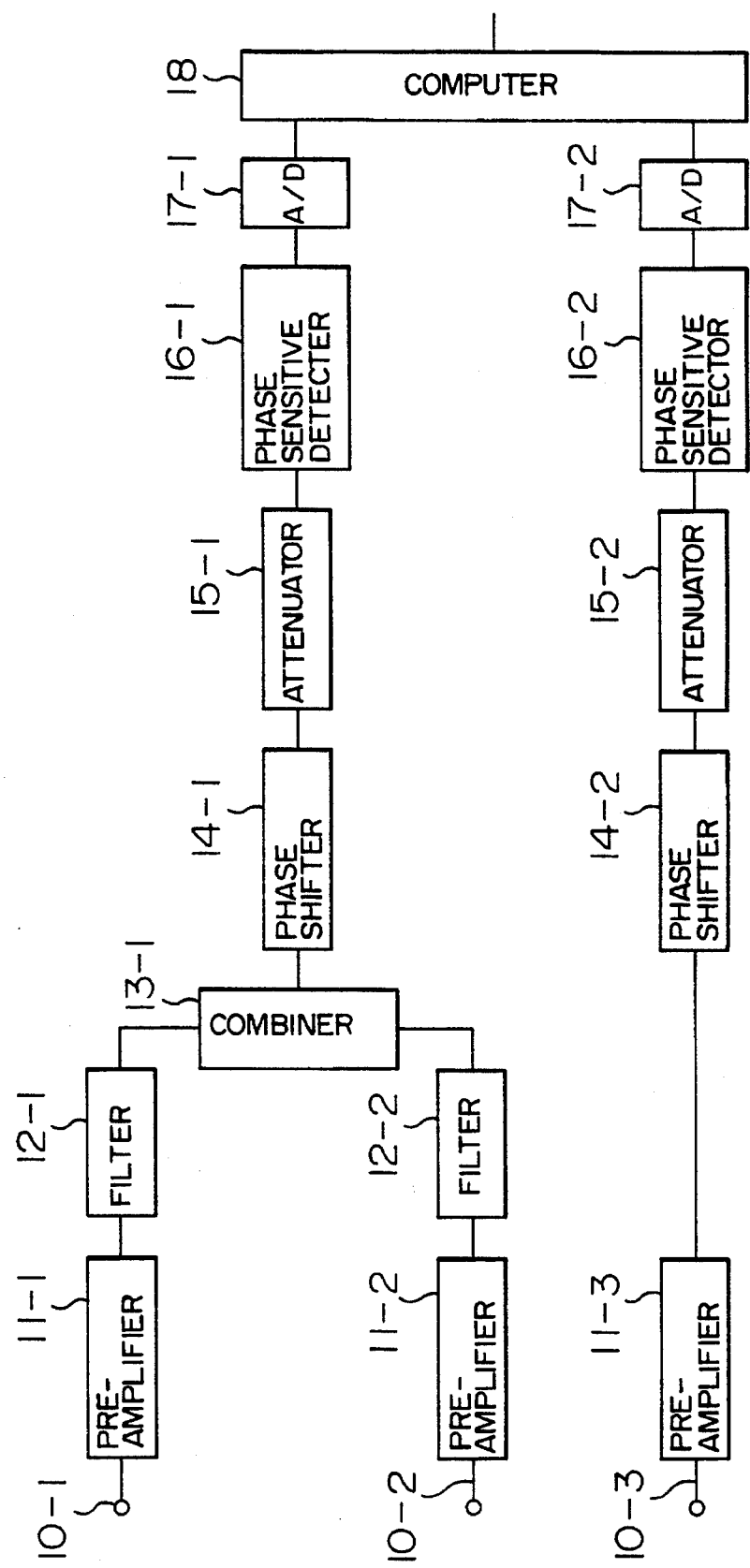
FIG. 5 is a block diagram showing an arrangement of another embodiment of the receiving circuit of the present invention.

FIG. 5 is a block diagram showing an arrangement of another embodiment of the receiving system employing the coil of the embodiment shown in FIG. 3.

The present embodiment has the same arrangement as that from the pre-amplifiers 11-1, 11-2 and 11-3 to the attenuators 15-1 and 15-2 of the embodiment of FIG. 4. In the present embodiment, the outputs of the attenuators 15-1 and 15-2 are respectively applied to phase sensitive detectors 16-1 and 16-2, and are converted into digital signals (detection data) by A/D converters 17-1 and 17-2, respectively, to be inputted to a computer 18. After the detection data which has been inputted to the computer 18 is temporarily stored in a memory unit (not shown) provided inside the computer 18 and is subjected to the Fourier transform, the resultant data signals are added to each other while being weighted in the respective frequency regions, whereby it is possible to perform the signal composition in which the amount of information is effectively utilized maximally.

Incidentally, in the present embodiment, the NMR signals are passed through the filters 12-1 and 12-2, respectively, and then are composed to each other by the combiner 13. However, even when the combiner is not used, but two systems each of which includes the phase shifter, the attenuator, the phase sensitive detector and the A/D converter are used, the same operation can be performed.

Figure 6:
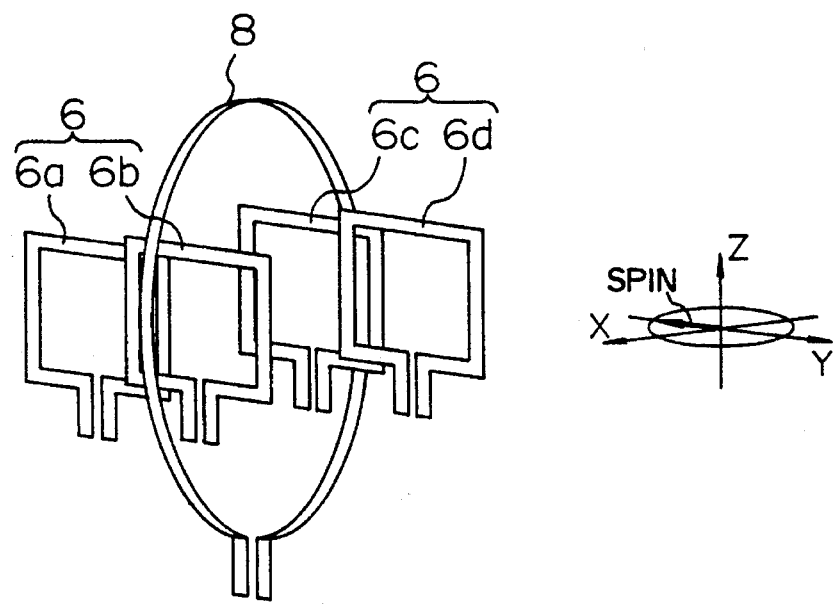
FIG. 6 is a perspective view showing an arrangement of another embodiment of the coil according to the present invention.

FIG. 6 is a perspective view showing an arrangement of another embodiment of the coil of the present invention. A multiple-coil 6 is arranged in such a way that a pair of unit surface coils 6a and 6b, and a pair of unit surface coils 6c and 6d are disposed in parallel with each other in the X-axis direction at a predetermined interval. In this connection, each of the pair of unit surface coils 6a and 6b and the pair of unit surface coils 6c and 6d are arranged in such a way that the paired unit surface coils are overlapped by a distance such that the mutual coupling therebetween becomes minimum and are disposed in a direction of the body axis (Y-axis direction) of the subject (not shown) in a unidimensional manner. The multiple-coil 6 serves to detect an NMR signal of the X-axis direction of the nuclear spin which rotates on the X-Y plane perpendicularly intersecting the direction of the static magnetic field (Z-axis direction). In other words, the multiple-coil 6 forms the magnetic field in the X-axis direction. In the outside of the multiple-coil 6 is arranged a solenoid coil 8 which has one turn or a plurality of turns (serial or parallel type) to form the magnetic field in the Y-axis direction perpendicularly intersecting the X-axis direction as the direction of the magnetic field formed by the multiple-coil 6.

Now, since the X-axis direction as the direction of the magnetic field formed by the multiple-coil 6 intersects perpendicularly the Y-axis direction as the direction of the magnetic field formed by the solenoid coil 8, both the coils do not interfere with each other. As a result, it is possible to detect simultaneously signals from the above-mentioned two coils. Therefore, the quadrature detection can be performed so that the detection can be performed at high sensitivity. Moreover, by switching the unit surface coils 6a, 6b, 6c and 6d using a switch or the like, the narrow region such as the head or the neck can be also photographed effectively with the field of view of the photographing being limited.

Figure 7:
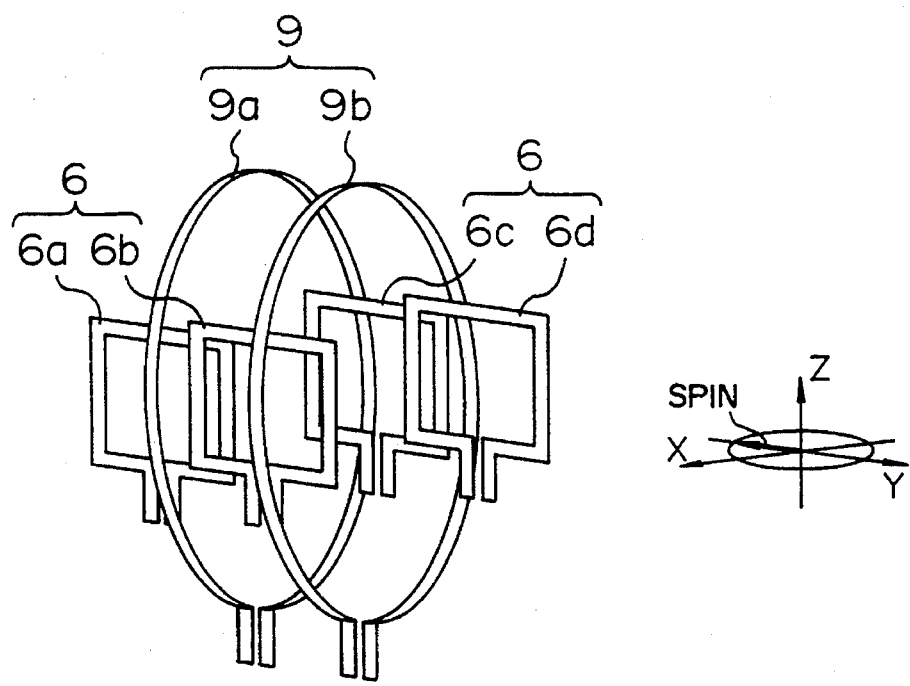
FIG. 7 is a perspective view showing an arrangement of still another embodiment of the coil according to the present invention.

FIG. 7 is a perspective view showing an arrangement of still another embodiment of the coil of the present invention. The present embodiment has the same arrangement as that of the embodiment shown in FIG. 6 except that a plurality of unit solenoid coils each of which has one turn or a plurality of turns (serial or parallel type) are arranged outside the multiple-coil 6. In the figure, a specific case where only the two unit solenoids are arranged is shown. That is, the unit solenoid coils 9a and 9b which are arrayed in the Y-axis direction make up the solenoid array coil 9. For the details of the solenoid array coil, the well-known technology which is described in 10-th SMRM, p. 724 (1991) can be utilized. The feature of the present embodiment is that since the sensitivity of the surface coil and the solenoid coil can be increased, the higher sensitivity can be attained. Moreover, since the solenoid coil 9a is arranged so as to correspond to the center part of the array coil 6a, the static or magnetic interference between the two coils can be readily removed. This can be also applied to the solenoid coil 9b and the array coil 6b.

Figure 8:
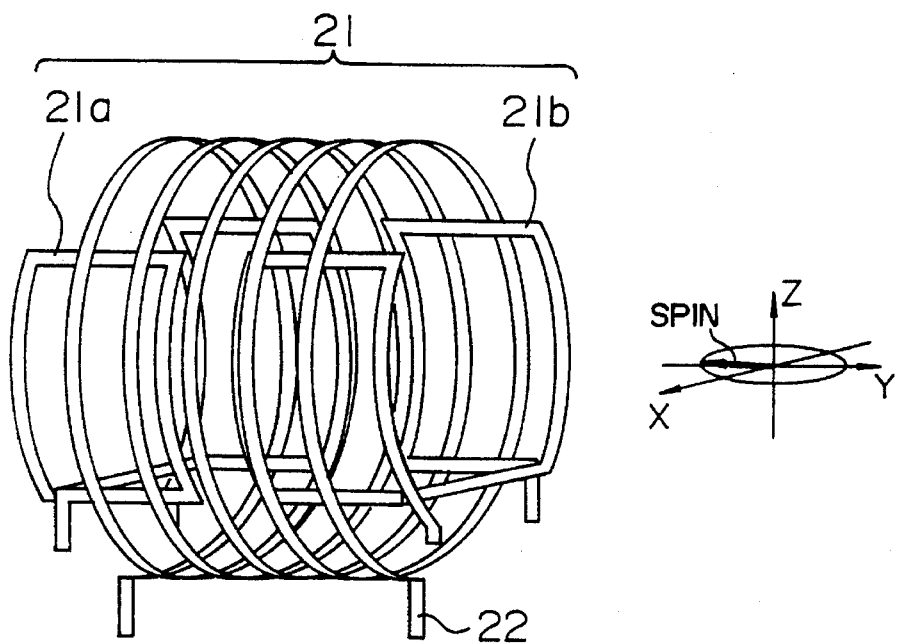
FIG. 8 is a perspective view showing an arrangement of yet another embodiment of the coil according to the present invention.

FIG. 8 is a perspective view showing an arrangement of yet another embodiment of the coil of the present invention. The present embodiment has the same arrangement as that of the embodiment shown in FIG. 6 except that instead of the surface coils, saddle type coils are employed. That is, a saddle type array coil 21 is arranged in such a way that unit saddle type coils 21a and 21b which are decoupled so as to have the minimum mutual coupling are disposed in the direction of the body axis (Y-axis direction) of the subject (not shown) in a unidimensional manner. While not illustrated in the figure, for the decoupling of the saddle type coils, a method of using the overlapping, a method of using a compensating coil, a method of using a circuit, and the like may be employed. The saddle type array coil 21 forms the magnetic field in the X-axis direction to detect an NMR signal of the X-axis direction of the nuclear spin which rotates on the X-Y plane perpendicularly intersecting the direction of the static magnetic field (Z-axis direction). In the outside of the above-mentioned saddle type array coil 21 is arranged a serial or parallel type solenoid coil 22 which forms the magnetic field in the Y-axis direction perpendicularly intersecting the X-axis direction as the direction of the magnetic field detected by the saddle type array coil 21. The solenoid coil 22 has one turn or a plurality of turns.

Now, since the X-axis direction as the direction of the magnetic field formed by the saddle type array coil 21 intersects perpendicularly the Y-axis direction as the direction of the magnetic field formed by the solenoid coil 22, both the coils do not interfere with each other. As a result, it is possible to detect simultaneously signals from the above-mentioned two coils. Therefore, the quadrature detection can be performed so that the sensitivity can be increased. Moreover, by switching the unit saddle type coils 21a and 21b using a switch or the like, the narrow region such as the head or the neck can be also photographed effectively with the field of view of the photographing being limited.

Figure 9:
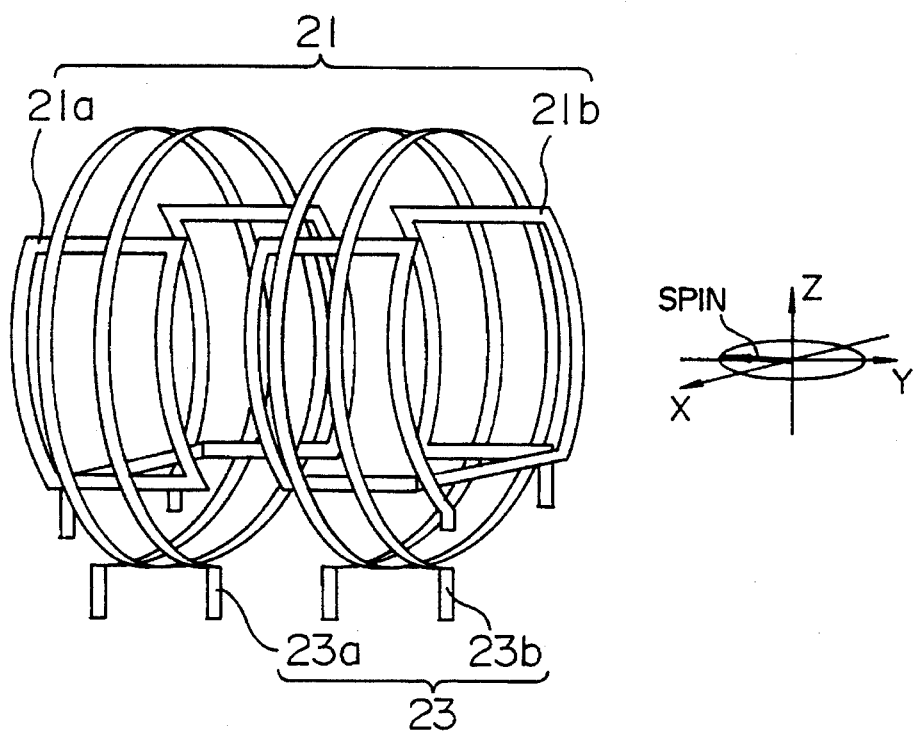
FIG. 9 is a perspective view showing an arrangement of a further embodiment of the coil according to the present invention.

FIG. 9 is a perspective view showing an arrangement of a further embodiment of the coil of the present invention. The present embodiment has the same arrangement as that of the embodiment shown in FIG. 8 except that a solenoid array coil 23 is made up of unit solenoid coils 23a and 23b which are decoupled so as to have the minimum mutual coupling, and the unit solenoid coils 23a and 23b are disposed in the direction of the body axis (Y-axis direction) of the subject (not shown) in a unidimensional manner. The saddle type array coil 21 forms the magnetic field in the X-axis direction to detect the NMR signal of the X-axis direction of the nuclear spin which rotates on the X-Y plane perpendicularly intersecting the direction of the static magnetic field (Z-axis direction). In the outside of the above-mentioned saddle type array coil 21 is arranged the solenoid array coil 23 in which the serial (or parallel) type unit solenoid coils 23a and 23b, each of which has two turns (one turn or a plurality of turns may be also available) to detect the magnetic field in the Y-axis direction perpendicularly intersecting the X-axis direction as the direction of the magnetic field formed by the saddle type array coil 21, are disposed in the Y-axis direction. The present embodiment has the same effects as those of the embodiment shown in FIG. 7.

Now, since the X-axis direction as the direction of the magnetic field formed by the saddle type array coil 21 intersects perpendicularly the Y-axis direction as the direction of the magnetic field detected by the solenoid array coil 23, both the coils do not interfere with each other. As a result, it is possible to detect simultaneously the signals from the above-mentioned two coils. Therefore, the quadrature detection can be performed so that the sensitivity can be increased as compared with the case of the saddle type array coil or the solenoid array coil. Incidentally, by switching the above-mentioned unit saddle type coils 21a and 21b using a switch or the like, the narrow region such as the head or the neck can be also photographed effectively with the field of view of the photographing being limited.

FIG. 10 is a block diagram showing an arrangement of one embodiment of a part of a receiving system employing the coil of the embodiment shown in FIG. 9. To input terminals 10-1, 10-2, 10-3 and 10-4 are respectively connected the unit saddle type coils 21a and 21b of the multiple-coil 21 and the unit solenoid coils 23a and 23b of the solenoid array coil 23 of FIG. 9 each pair of which are disposed in a unidimensional manner so as to have the minimum mutual coupling. The NMR signals which have been received at the input terminals 10-1, 10-2, 10-3 and 10-4 are respectively amplified by pre-amplifiers 11-1, 11-2, 11-3 and 11-4 which have respective impedance matching circuits. Then, the bands of the resultant signals are respectively limited through filters 12-1, 12-2, 12-3 and 12-4 in such a way that the noises sent from the coils 21a, 21b, 23a and 23b are not superposed on one another. Then, the resultant signals are composed by combiners 13-1 and 13-2. The output terminals of the combiners 13-1 and 13-2 are respectively connected to the phase shifters 14-1 and 14-2 shown in FIG. 4 or FIG. 5. The subsequent operations are the same as in the case of the system shown in FIG. 4 or FIG. 5.

FIG. 11 is a block diagram showing an arrangement of another embodiment of the receiving system employing the coil of the embodiment shown in FIG. 9. To the input terminals 10-1, 10-2, 10-3 and 10-4 are respectively inputted the signals which have been sent from the unit saddle type coil 21a, the unit solenoid coil 23a, the unit saddle type coil 21b and the unit solenoid coil 23b (refer to FIG. 9). Then, the signals which have been inputted to the input terminals 10-1, 10-2, 10-3 and 10-4 are respectively amplified by the pre-amplifiers 11-1, 11-2, 11-3 and 11-4. The phases of the outputs which have been sent from the pre-amplifiers 11-1 and 11-2 (11-3 and 11-4) are respectively adjusted in such a way that they become in phase with each other by the phase shifters 14-1 and 14-2 (14-3 and 14-4). More specifically, for example, the amount of phase shift of the phase shifter 14-1 (14-3) is set to 0 degree, and that of the phase shifter 14-2 (14-4) is set to +90 degrees or −90 degrees. Next, the gains for the outputs of the phase shifters 14-1 and 14-2 (14-3 and 14-4) are adjusted so as to fulfill the above-mentioned optimal conditions by the attenuators 15-1 and 15-2 (15-3 and 15-4). Then, the outputs which have been sent from the attenuators 15-1 and 15-2 (15-3 and 15-4) are composed by the combiner 13-1 (13-2). The output of the combiner 13-1 (13-2) is applied to the phase sensitive detector 16-1 (16-2) and then the noise having a unnecessary frequency band is removed by the filter 12-1 (12-2). The output signals which have been sent from the filters 12-1 and 12-2 are composed by the combiner 13-3 and then the composite signal is converted into the digital signal by the A/D converter 17. The filters 12-1 and 12-2, and the combiner 13-3 may be replaced with an analog high speed switch. Moreover, such a processing may be adopted that after the outputs of the phase sensitive detectors 16-1 and 16-2 are directly subjected to the A/D conversion, the resultant digital signals are composed digitally.

The present embodiment is designed in such a way that after the signals sent from the pair of the unit saddle type coil 21a and the unit solenoid coil 23a (and the pair of the unit saddle type coil 21b and the unit solenoid coil 23b) are adjusted with respect to their phases and gains and then are composed, the composite signals are further composed. Therefore, the present embodiment can perform the same functions as those of the above-mentioned other embodiments.

We claim:

1. An RF probe for an MRI apparatus in a vertical magnetic field system, comprising:

(a) an RF array coil comprising a plurality of first unit coils which are arranged in a direction perpendicular to a direction of a static magnetic field, for forming an RF magnetic field in a direction perpendicular to the direction of the static magnetic field, each of said first unit coils forming the RF magnetic field independently of one another, and said RF array coil being arranged so that a mutual coupling between the adjacent first unit coils becomes a minimum; and (b) an RF coil which forms an RF magnetic field in a direction perpendicular to both a direction of the RF magnetic field formed by said RF array coil and said direction of said static magnetic field, said RF coil being arranged in a space surrounding a subject to be inspected.

2. An RF probe for an MRI apparatus according to claim 1, wherein the adjacent first unit coils are overlapped.

3. An RF probe for an MRI apparatus according to claim 1, wherein said RF coil includes a plurality of second unit coils, said RF coil being arranged so that a mutual coupling between the adjacent second unit coils becomes a minimum.

4. An RF probe for an MRI apparatus according to claim 1, wherein said RF coil includes a solenoid coil.

5. An RF probe for an MRI apparatus according to claim 1, wherein said first unit coil includes a saddle type coil.

6. An RF probe for an MRI apparatus according to claim 1, further comprising means for switching the plurality of first unit coils independently of one another.

7. An RF probe for an MRI apparatus in a vertical magnetic field system, comprising:

(a) an RF array coil comprising a plurality of first unit coils which are arranged in a direction perpendicular to a direction of a static magnetic field, for forming an RF magnetic field in a direction perpendicular to the direction of the static magnetic field, each of said first unit coils forming the RF magnetic field independently of one another, and said RF array coil being arranged so that a mutual coupling between the adjacent first unit coils becomes a minimum; and (b) an RF coil which forms an RF magnetic field in a direction perpendicular to both a direction of the RF magnetic field formed by said RF array coil and said direction of said static magnetic field, said RF coil being arranged outside of said RF array coil so that said RF coil surrounds said RF array coil.

* * * * *